United States Patent
Wang et al.

(10) Patent No.: US 9,880,616 B2
(45) Date of Patent: Jan. 30, 2018

(54) DISPLAY DEVICE AND METHOD FOR MANUFACTURING THE SAME

(71) Applicants: BOE TECHNOLOGY GROUP CO., LTD., Beijing (CN); BEIJING BOE DISPLAY TECHNOLOGY CO., LTD., Beijing (CN)

(72) Inventors: Junwei Wang, Beijing (CN); Xiaopeng Cui, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 41 days.

(21) Appl. No.: 14/915,604

(22) PCT Filed: Jul. 28, 2015

(86) PCT No.: PCT/CN2015/085264
§ 371 (c)(1),
(2) Date: Feb. 29, 2016

(87) PCT Pub. No.: WO2016/138730
PCT Pub. Date: Sep. 9, 2016

(65) Prior Publication Data
US 2017/0003737 A1      Jan. 5, 2017

(30) Foreign Application Priority Data
Mar. 2, 2015  (CN) .......................... 2015 1 0093404

(51) Int. Cl.
*H01L 51/50*      (2006.01)
*H01L 51/56*      (2006.01)
(Continued)

(52) U.S. Cl.
CPC ............ *G06F 3/011* (2013.01); *G02F 1/1333* (2013.01); *G06F 1/1601* (2013.01); *G09G 3/20* (2013.01);
(Continued)

(58) Field of Classification Search
CPC ........... G02F 1/133305; H01L 51/0097; H01L 2251/5338
See application file for complete search history.

(56) References Cited

U.S. PATENT DOCUMENTS 9,331,126 B2 *   5/2016   Lee ..................... H01L 27/3244
2012/0014054 A1  1/2012   Ashcraft
(Continued)

FOREIGN PATENT DOCUMENTS

CN    1714309 A      12/2005
CN    101359117 A    2/2009
(Continued)

OTHER PUBLICATIONS

Office Action in Chinese Patent Application No. 201510093404.4, dated Nov. 30, 2016.
(Continued)

*Primary Examiner* — Mariceli Santiago
(74) *Attorney, Agent, or Firm* — Brooks Kushman P.C.

(57) ABSTRACT

The present provides a display device and a method for manufacturing the same. The display device includes a first substrate and a second substrate arranged opposite to each other to form a display panel. A deformation layer is arranged on any surface of the display panel. Through the deformation layer on any surface of the display panel, when the deformation layer reaches a first deformation temperature, the deformation layer generates a deformation so as to apply an internal force to the display panel. Because the display panel is of a constant size, it is curved due to the
(Continued)

internal force, so as to achieve curved-surface display. In other words, the display panel is curved under the effect of the internal force generated by itself, and it may be always maintained at its curved shape when the internal force is applied continuously.

19 Claims, 10 Drawing Sheets

(51) Int. Cl.
| | | |
|---|---|---|
| *G06F 3/01* | (2006.01) | |
| *G09G 3/20* | (2006.01) | |
| *G06F 1/16* | (2006.01) | |
| *H04N 5/64* | (2006.01) | |
| *G02F 1/1333* | (2006.01) | |
| *H01L 51/00* | (2006.01) | |

(52) U.S. Cl.
CPC ..... *G09G 3/2092* (2013.01); *G02F 1/133305* (2013.01); *G09G 2354/00* (2013.01); *G09G 2380/02* (2013.01); *H01L 51/0097* (2013.01); *H01L 2251/5338* (2013.01); *H04N 5/64* (2013.01)

(56) References Cited

U.S. PATENT DOCUMENTS

| | | | |
|---|---|---|---|
| 2014/0045283 A1* | 2/2014 | Hirakata | H01L 51/56 438/22 |
| 2014/0054438 A1 | 2/2014 | Yun | |
| 2014/0314999 A1* | 10/2014 | Song | G06F 1/1601 428/174 |
| 2014/0354791 A1 | 12/2014 | Lee et al. | |
| 2015/0171354 A1* | 6/2015 | Lee | H01L 27/3244 438/26 |
| 2016/0066445 A1* | 3/2016 | Park | H01L 51/52 361/749 |
| 2016/0089855 A1* | 3/2016 | Gwin | B32B 27/06 428/212 |
| 2016/0147262 A1* | 5/2016 | Lee | G06F 1/1626 345/173 |
| 2016/0278246 A1* | 9/2016 | Yu | G02F 1/133305 |

FOREIGN PATENT DOCUMENTS

| | | |
|---|---|---|
| CN | 102289120 A | 12/2011 |
| CN | 103093699 A | 5/2013 |
| CN | 103854571 A | 6/2014 |
| CN | 103984155 A | 8/2014 |
| CN | 104219471 A | 12/2014 |
| CN | 104375333 A | 2/2015 |
| CN | 104794993 A | 7/2015 |
| JP | H11109880 A | 4/1999 |
| JP | 2001118680 A | 4/2001 |
| JP | 2011248363 A | 12/2011 |
| WO | 9411779 A2 | 5/1994 |

OTHER PUBLICATIONS

Written Opinion of the International Searching Authority, PCT/CN2015/085264.
Second Office Action for Chinese Application No. 201510093404.4, dated Jul. 28, 2017, 9 Pages.

* cited by examiner

DISPLAY DEVICE AND METHOD FOR MANUFACTURING THE SAME

CROSS-REFERENCE TO RELATED APPLICATION

The present application is the U.S. national phase of PCT Application No. PCT/CN2015/085264 filed on Jul. 28, 2015, which claims a priority of the Chinese patent application No. 201510093404.4 filed on Mach 2, 2015, which is incorporated herein by reference in its entirety.

TECHNICAL FIELD

The present disclosure relates to the field of display technology, in particular to a display device and a method for manufacturing the same.

BACKGROUND

Depending on their shapes, display devices may be divided into flat-panel display devices and curved-surface display devices. The flat-panel display devices include televisions (TVs), liquid crystal display panels, electronic papers, organic light-emitting diode (OLED) panels, mobile telephones or flat-panel computers, etc. The curved-surface display devices include curved-surface televisions, curved-surface mobile phones or curved-surface computers.

Taking the curved-surface television as an example, it refers to a television which has a curved-surface display function and which is provided with a curved-surface characteristic in conformity with that of an eyeball so as to provide an equal distance between each point on a screen and an eye. The curved-surface television includes a display panel and a backlight assembly. A first substrate and a second substrate are arranged opposite to each other to form a cell, thereby to form the display panel. Usually, an external mechanical force is applied to the display panel so as to curve it, and a curved shape of the display panel is maintained by a shell in the backlight assembly.

However, it is found by the inventor that, it is difficult to assemble the curved-surface television when the curved shape of the display panel is maintained by the shell in the backlight assembly.

SUMMARY

Technical Problem to be Solved

The present disclosure provides a display device and a method for manufacturing the same, which can solve the problem in the relayed art that it is difficult to assemble the curved-surface television.

Technical Solution

In one aspect, the present disclosure provides in some embodiments a display device, including a first substrate and a second substrate which are arranged opposite to each other to form a display panel. A deformation layer is arranged at any surface of the display panel and configured to enable the display panel to generate first deformation when it reaches a first deformation temperature, so as to enable the display device to achieve curved-surface display.

Alternatively, the deformation layer is extended or retracted so as to generate the first deformation.

Alternatively, the deformation layer is made of an electrically-controlled shape memory material and reaches the first deformation temperature through heat generated when it is energized.

Alternatively, the electrically-controlled shape memory material is a shape memory polymer doped with conductive carbon black, metallic powder or conductive polymer.

Alternatively, the display panel further includes a driver circuit connected to the deformation layer.

Alternatively, the deformation layer is made of a thermally-controlled shape memory material, the display device further includes a conductive layer, the conductive layer and the deformation layer are arranged on any surface of the display panel from the bottom up, and the deformation layer reaches the first deformation temperature through heat generated when the conductive layer is energized.

Alternatively, the thermally-controlled shape memory material is a shape memory polymer.

Alternatively, the display panel further includes a driver circuit connected to the conductive layer.

Alternatively, the deformation layer is configured to enable the display panel to generate a second deformation when it is restored from the first deformation temperature to a second deformation temperature, so as to enable the display device to achieve flat-panel display.

Alternatively, the first deformation temperature is 80° C. to 90° C. and the second deformation temperature is 20° C. to 25° C., or the first deformation temperature is 20° C. to 25° C. and the second deformation temperature is 80° C. to 90° C.

Alternatively, the deformation layer is formed as a grid including a plurality of segments in a Y-axis direction and a plurality of segments in an X-axis direction, the plurality of segments in the Y-axis direction is arranged longitudinally and parallel to each other, each segment in the Y-axis direction is a straight line, the plurality of segments in the X-axis direction is arranged laterally and parallel to each other, and each segment in the X-axis direction is provided with a predetermined shape.

Alternatively, the predetermined shape of each segment in the X-axis direction is a waveform line, a mountain-like line, a hyperbolic curve or a rectangular-wave.

Alternatively, all portions of each segment in the X-axis direction are in a shape of the predetermined shape.

Alternatively, the portions of each segment in the X-axis direction are arranged non-uniformly; the predetermined shape at two end portions of each segment in the X-axis direction has a larger deformation amount, the predetermined shape at a middle portion of each segment in the X-axis direction has a smaller deformation amount.

Alternatively, each segment in the X-axis direction is topically in a shape of the predetermined shape.

Alternatively, each segment in the X-axis direction includes a middle portion in a shape of a straight-line, and two end portions each in a shape of the predetermined shape.

Alternatively, the deformation layer includes a plurality of elongated holes arranged regularly, and each elongated hole extends along the Y-axis direction.

Alternatively, each elongated hole is of a fusiform hole or rectangular hole.

Alternatively, the elongated holes are arranged symmetrically relative to a Y-axis direction of the deformation layer.

Alternatively, the elongated holes are arranged evenly.

Alternatively, when the deformation layer reaches the first deformation temperature, each elongated hole is deformed and extends in the X-axis direction to form an enlarged hole.

Alternatively, the elongated holes are arranged unevenly.

Alternatively, the elongated holes are arranged sparser in the middle of the deformation layer and denser at the two ends of the deformation layer.

Alternatively, the display device further includes a processing module configured to calculate the deformation amount of the deformation layer in accordance with a curvature, and calculate the first deformation temperature in accordance with the deformation amount.

Alternatively, the display device further includes a sensing module and a distance measuring unit through which the sensing module is connected to the processing module. The sensing module is configured to detect a viewer's position, and the distance measuring unit is configured to acquire a distance between the viewer and the display device and convert the distance into the curvature.

In another aspect, the present disclosure provides in some embodiments a method for manufacturing a display device, including steps of: forming a deformation layer on a first surface of a first substrate: arranging a second surface of the first substrate and a second substrate opposite to each other, thereby forming a display panel; assembling the display panel with further components, thereby forming a complete display device, and enabling, by the deformation layer at a first deformation temperature, the display panel to be curved and generate first deformation to enable the display device to achieve curved-surface display, and maintaining the first deformation for a predetermined period of time.

Alternatively, the first substrate is an array substrate, and before the formation of the deformation layer on the first surface of the first substrate, patterns have been formed on the second surface of the first substrate.

Alternatively, the deformation layer is made of a thermally-controlled shape memory material, and the display device further includes a conductive layer. The step of forming the deformation layer on the first surface of the first substrate includes: forming the conductive layer on the first surface of the first substrate, and reserving room for wires of a circuit: applying a photoresist layer onto a surface of the conductive layer, and exposing and developing the photoresist layer; and applying the thermally-controlled shape memory material onto a surface of the exposed and developed photoresist layer, and removing the remaining photoresist from the first substrate with the thermally-controlled shape memory material.

Alternatively, the deformation layer is made of an electrically-controlled shape memory material, and the step of forming the deformation layer on the first surface of the first substrate includes: applying a photoresist layer onto the first surface of the first substrate, and exposing and developing the photoresist; and applying the electrically-controlled shape memory material onto a surface of the exposed and developed photoresist layer, reserving sufficient room for wires of a circuit, and removing the remaining photoresist from the first substrate with the electrically-controlled shape memory material.

Alternatively, the deformation layer is made of a transparent material, and the step of removing the remaining photoresist from the first substrate with the thermally-controlled or electrically-controlled shape memory material includes removing the remaining photoresist from the first substrate with the thermally-controlled or electrically-controlled shape memory material by a secondary exposing and developing process.

Alternatively, the deformation layer is made of a non-transparent material, and the step of removing the remaining photoresist from the first substrate with the thermally-controlled or electrically-controlled shape memory material includes removing the remaining photoresist from the first substrate with the thermally-controlled or electrically-controlled shape memory material using an alkaline stripping liquid.

Beneficial Effect

According to the embodiments of the present disclosure, the deformation layer is arranged on any surface of the display panel, and when the deformation layer reaches the first deformation temperature, the deformation is generated so as to apply an internal force to the display panel. Because the display panel is of a constant size, it will be curved due to the internal force, so as to achieve the curved-surface display. In other words, the display panel in the embodiments of the present disclosure is curved under the effect of the internal force generated by itself, and it may be always maintained at the curved shape when the internal force is applied continuously. As a result, it is unnecessary to maintain the curved shape of the display panel with a shell of an existing backlight assembly, and thereby it is able to reduce the assembly difficulty.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

Figure 1:
FIG. 1 is a schematic view showing a display device before being deformed according to one embodiment of the present disclosure.

REFERENCE SIGN LIST 1 display panel
1 first substrate
11 first surface of first substrate
12 second surface of first substrate
2 second substrate
21 first surface of second substrate
22 second surface of second substrate
31 conductive layer
32 deformation layer
32A thermally-controlled shape memory material
32B secondary exposing and developing process
32C electrically-controlled shape memory material
321 segment in X-axis direction
322 segment in Y-axis direction
323 elongated hole
33 photoresist layer
34 exposed and developed surface of photoresist layer
4 first polarizer
5 second polarizer
6 processing module
7 sensing module
8 distance measuring unit
100 display device

DETAILED DESCRIPTION OF THE EMBODIMENTS

In order to make the objects, the technical solutions and the advantages of the present disclosure more apparent, embodiments of the present disclosure will be described hereinafter in conjunction with the drawings.

First Embodiment

As shown in FIG. 1, the present disclosure provides in this embodiment a display device, which includes a first substrate 1 and a second substrate 2 arranged opposite to each other to form a display panel I.

A deformation layer 32 is arranged at any surface of the display panel I. The deformation layer 32 is configured to, when reaching a first deformation temperature, enable the display panel I to generate first deformation, so as to enable the display device to achieve curved-surface display.

As shown in FIG. 1, the any surface of the display panel I refers to a surface of the display panel I exposed to the outside, i.e., a first surface 11 of the first substrate or a first surface 21 of the second substrate. The first surface 11 of the first substrate refers to a surface of the first substrate away from the second substrate 2, and the first surface 21 of the second substrate refers to a surface of the second substrate away from the first substrate 1.

As is known in the art, the display panel I includes a color filter substrate and an array substrate. A substrate of the display panel I facing a viewer is the color filter substrate, while the other substrate is the array substrate.

In this embodiment, the display panel I includes the first substrate 1 and the second substrate 2. It should be appreciated that, the first substrate 1 and the second substrate 2 are relative concepts to each other. To be specific, the first substrate 1 may be the color filter substrate or the array substrate, while the second substrate 2 may be the array substrate or the color filter substrate. When one substrate is defined as the first substrate 1, the other substrate of the display panel I is just the second substrate 2.

In FIGS. 1, 2, 3 and 4, the substrate where the deformation layer 32 is arranged is defined as the first substrate 1.

More specifically, as shown in FIG. 1, an upper surface of the display panel I, i.e., a surface facing the viewer, is defined as a display surface. The second substrate 2 faces the viewer, so the second substrate 2 is the color filter substrate and the first substrate 1 is the array substrate. The terms "upper" and "lower" are relative concepts to each other, and taking FIG. 1 as an example, "upper" and "lower" just refer to the positions as viewed in FIG. 1.

Figure 2:
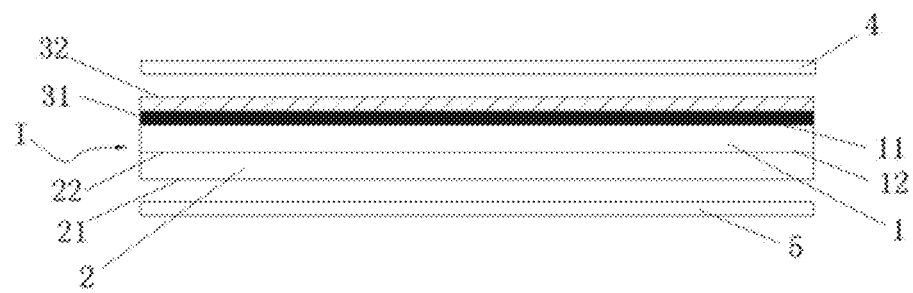
FIG. 2 is another schematic view showing the display device before being deformed according to one embodiment of the present disclosure.

Similarly, as shown in FIG. 2, the first substrate 1 is the color filter substrate while the second substrate 2 is the array substrate.

Figure 3:
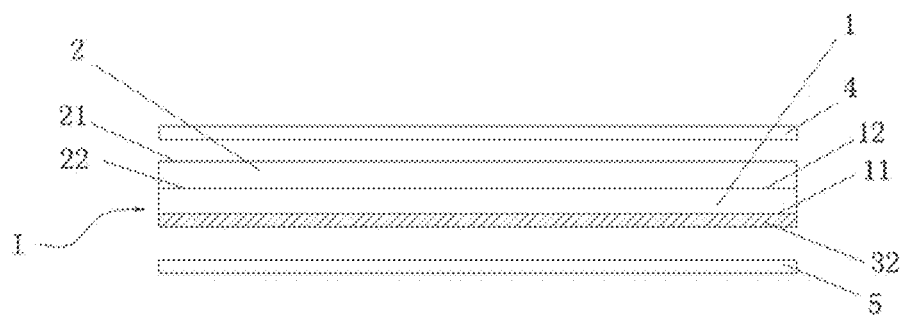
FIG. 3 is yet another schematic view showing the display device before being deformed according to one embodiment of the present disclosure.

Similarly, as shown in FIG. 3, the second substrate 2 is the color filter substrate while the first substrate 1 is the array substrate.

Figure 4:
FIG. 4 is still yet another schematic view showing the display device before being deformed according to one embodiment of the present disclosure.

Similarly, as shown in FIG. 4, the first substrate 1 is the color filter substrate while the second substrate 2 is the array substrate.

In this embodiment, the first deformation refers to the situation where the display device is changed from flat-surface display to curved-surface display.

Figure 1A:
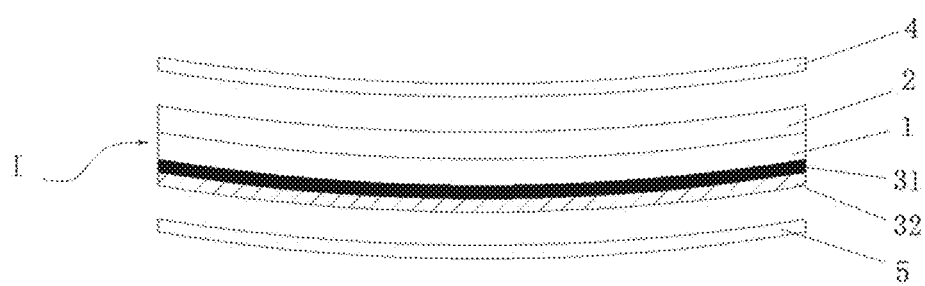
FIG. 1A is a schematic view showing the display device in FIG. 1 after being deformed.

As shown in FIG. 1A, the so-called "curved-surface display" refers to the situation where the display panel I is curved in such a manner as to be in conformity with a curve characteristic of an eyeball. When the eyeball of the viewer is located at an optimal viewing point (i.e., at a center of a curvature), there is an equal distance between each point on the display panel I and the eyeball of the viewer.

As shown in FIG. 1, according to the embodiment of the present disclosure, the deformation layer 32 is arranged on any surface of the display panel I. When reaching the first deformation temperature, the deformation layer 32 generates the first deformation, and applies an internal force onto the display panel I. Because the display panel I is of a constant size, as shown in FIG. 1A, the display panel I may be curved due to the internal force, so as to achieve the curved-surface display. In other words, the display panel I in the embodiment of the present disclosure is curved due to the internal force generated by itself, and the curved shape may be always maintained under the effect of the internal force. As a result, it is unnecessary to maintain the curved shape of the display panel using a shell of an existing backlight assembly, and thereby reducing the assembly difficulty.

In addition, in the embodiment of the present disclosure, the deformation layer 32 is arranged on any surface of the display panel I so as to achieve the curved-surface display, and it is unnecessary to maintain the curved shape of the display panel using the shell of the existing backlight assembly, so the integration of the display panel I is improved.

In addition, in the embodiment of the present disclosure, the deformation layer 32 is arranged on any surface of the display panel I so as to achieve the curved-surface display, and it is unnecessary to maintain the curved shape of the display panel using the shell of the existing backlight assembly, so the display panel may be applied to a transparent display device without any backlight assembly, thereby to provide a wider application range.

In addition, in the embodiment of the present disclosure, the deformation layer 32 is arranged on any surface of the display panel I so as to achieve the curved-surface display, and it is unnecessary to maintain the curved shape of the display panel using the shell of the existing backlight assembly, so a light and thin display device can be provided.

As shown in FIG. 3, the deformation layer 32 may be made of an electrically-controlled shape memory material. The deformation layer 32 reaches the first deformation temperature through heat generated when the deformation layer 32 is energized. To be specific, the deformation layer 32 is arranged on the first surface 11 of the first substrate. i.e., the first surface of the array substrate.

As shown in FIG. 3, when the deformation layer 32 reaches the first deformation temperature through the heat generated when it is energized, it is able to prevent an operation temperature of the display device from being adversely affected by the first deformation temperature.

As shown in FIG. 3, more specifically, the electrically-controlled shape memory material adopted by the deformation layer 32 may be a market-available material. The electrically-controlled shape memory material may be a shape memory polymer (SMP) doped with conductive carbon black, metallic powder or conductive polymer.

As shown in FIG. 3, the deformation layer 32 reaching the first deformation temperature refers to reaching a memory temperature of the electrically-controlled shape memory material.

More specifically, considering the operation temperature of the display device, the first deformation temperature is usually within a range from 80° C. to 90° C. Of course, it should be appreciated that, the first deformation temperature is not limited thereto, and any other temperature may also be set as the first deformation temperature, as long as the design requirements are met.

As shown in FIG. 3, the display panel I may further include a driver circuit (not shown) connected to the deformation layer 32.

As is known in the art, the display panel I displays an image under the control of the driver circuit, and the driver circuit mainly functions as to convert a format of a data signal and output the data signal under the control of the display sequence signal. The deformation layer 32 is energized when a high level is inputted by the driver circuit to the deformation layer 32.

The embodiment of FIG. 4 differs from the embodiment of FIG. 3 merely in that the deformation layer 32 being arranged on the first surface of the color filter substrate has a different meaning. In this embodiment, the first surface of the first substrate refers to a first surface of the color filter substrate.

As shown in FIG. 1, the deformation layer 32 may also be made of a thermally-controlled shape memory material. The display device further includes a conductive layer 31. The conductive layer 31 and the deformation layer 32 are sequentially stacked on any surface of the display panel I from bottom to up. The deformation layer 32 reaches the first deformation temperature through heat generated when the conductive layer 31 is energized. This structure is simple and may be easily implemented.

Of course, it should be appreciated that, the conductive layer 31 and the deformation layer 32 may be sequentially stacked on any surface of the display panel I from top to down.

As shown in FIG. 1, the so-called "any surface of the display panel I" refers to the first surface 11 of the first substrate, i.e., the first surface of the array substrate. In the embodiments of the present disclosure, the terms "top" and "bottom" are defined in accordance with distances of the layers to the first surface 11 of the first substrate. To be specific, a layer close to the first surface 11 of the first substrate is defined as being located at the bottom, while a layer away from the first surface 11 of the first substrate is defined as being located at the top.

As shown in FIG. 1, the conductive layer 31 and the deformation layer 32 are arranged on the first surface 11 of the first substrate (i.e., the first surface of the array substrate).

As shown in FIG. 1 the deformation layer 32 may be made of a market-available thermally-controlled shape memory material, such as a shape memory polymer (SMP).

The first deformation temperature of the deformation layer 32 is just a memory temperature of the thermally-controlled shape memory material.

Specifically, considering the operation temperature of the display device, the first deformation temperature is usually within a range from 80° C. to 90° C. Of course, it should be appreciated that, the first deformation temperature is not limited thereto, and any other temperature may also be set as the first deformation temperature, as long as the design requirements are met.

As shown in FIG. 1, the conductive layer 31 may be a transparent conductive layer so as to allow light to pass therethrough. The light may pass through the deformation layer 32 by means of the structure or material of the deformation layer 32 itself.

As shown in FIG. 1, in this embodiment, the display panel I may further include a driver circuit connected to the conductive layer 31.

As is known in the art, the display panel I displays an image under the control of the driver circuit, and the driver circuit mainly functions as to convert a format of a data signal and output the data signal under the control of a display sequence signal. The conductive layer 31 is energized when a high level is inputted by the driver circuit to the conductive layer 31.

The embodiment of FIG. 2 differs from the embodiment of FIG. 1 merely in that the conductive layer 31 and the deformation layer 32 being arranged on the first surface 11 of the first substrate has a different meaning. In this embodiment, the first surface 11 of the first substrate refers to the first surface of the color filter substrate.

As shown in FIG. 1 (or, FIG. 2, or FIG. 3, or FIG. 4), the deformation layer 32 is configured to, when restoring from the first deformation temperature to a second deformation temperature, enable the display panel I to generate second deformation, so as to enable the display device to achieve flat-surface display.

The second deformation temperature usually refers to a normal temperature of 20° C. to 25° C. The second deformation refers to the situation where the display device is changed from the curved-surface display to the flat-surface display.

As shown in FIG. 1, an operation procedure will be described hereinafter by taking the display device in FIG. 1 as an example. When the display device is started, the display panel I is configured to achieve the flat-surface display, i.e., the display device is configured to achieve the flat-surface display.

When the conductive layer 31 is energized, the deformation layer 32 reaches the first deformation temperature (80° C. to 90° C.) and generates the first deformation, so as to convert the flat-surface display to the curved-surface display, i.e., the display device has a conversion function from the flat-surface display to the curved-surface display.

When the conductive layer 31 is deenergized, the deformation layer 32 is restored from the first deformation temperature (80° C. to 90° C.) to the second deformation temperature (20° C. to 25° C.) and generates the second deformation, so as to convert the curved-surface display to the flat-surface display, i.e., the display device has a conversion function from the curved-surface display to the flat-surface display.

When the display device is started and the conductive layer 31 is not energized, the deformation layer 32 has no change. At this point, the display panel I and the display device are configured to achieve the flat-surface display, i.e., the display device has a pure flat-surface display function.

It is found by the inventor that, the display panel I and the backlight assembly in the related art are each of a curved shape, and this curved shape is maintained all the time, so an existing curved-surface TV is merely used to achieve the curved-surface display. It is also found that, the curvatures of the existing curved-surface TV are set in two ways. In a first mode, a fixed curvature is provided. i.e., the curvature of the curved-surface TV is unique, and accordingly, an optimal viewing point, i.e., a center of the curvature, for the curved-surface TV is unique too. In a second mode, an adjustable curvature is provided, i.e., the curvature of the curved-surface TV may be adjusted. Once the curvature has been adjusted, the optical viewing point, i.e., a center of the curvature, is also fixed. Regardless of the setting modes of the curvatures, there is only one optical viewing point for the curved-surface TV, so a better effect may be achieved when there is a single viewer. However, when there are several viewers, it is unable to achieve an ideal viewing effect.

As shown in FIG. 1, as compared with the related art, the deformation layer 32 is arranged on any surface of the display panel I in the embodiment of the present disclosure, and the first deformation is generated when the deformation layer 32 reaches the first deformation temperature, so the display device is converted from the flat-surface display to the curved-surface display. When the deformation layer 32 reaches the second deformation temperature, the second deformation is generated, so the display device is converted from the curved-surface display to the flat-surface display.

When the display device is started, the flat-surface display is provided. In other words, the display device in the embodiment of the present disclosure has a conversion function from the curved-surface display to the flat-surface display, a conversion function from the flat-surface display to the curved-surface display, and a pure flat-surface display function. When there is only one viewer, the display device may be converted from the flat-surface display to the curved-surface display, and when there are several viewers, the pure flat-surface display function may be used, or the display device may be converted from the curved-surface display to the flat-surface display. In this way, it is able to improve the flexibility as well as the user experience.

In addition, through the deformation layer 32 on the display panel I, it is able to convert from the flat-surface display to the curved-surface display or from the curved-surface display to the flat-surface display. As a result, it is unnecessary to provide a backplate corresponding to the display device with a curved shape, thereby to facilitate the installation of the display device, e.g., it may be placed on a desk or hung on the wall.

In addition, through the deformation layer 32 on the display panel I, it is able to convert from the flat-surface display to the curved-surface display or from the curved-surface display to the flat-surface display. As a result, when the display device is unused, the display device is maintained to have a flat shape, and thereby it is able to provide a well appearance.

In addition, through the deformation layer 32 on the display panel I, it is able to convert from the flat-surface display to the curved-surface display or from the curved-surface display to the flat-surface display. As a result, when the display device is unused, the display device is maintained to have a flat shape, and then the display device can be transported in flat shape, which helps to reduce bumps when encountering turbulence during transportation, thereby improving safety of products.

FIG. 2 shows the principle for the conversion function from the flat-surface display to curved-surface display, the conversion function from the curved-surface display to the flat-surface display or the pure flat-surface display function of the display device. The details may refer to those mentioned in the embodiment as shown in FIG. 1, and will not be repeated herein.

FIG. 3 or FIG. 4 shows the principle for the conversion function from the flat-surface display to curved-surface display, the conversion function from the curved-surface display to the flat-surface display or the pure flat-panel display function of the display device. The details may refer to those mentioned in the embodiment as shown in FIG. 1, and will not be repeated herein.

Figure 5:
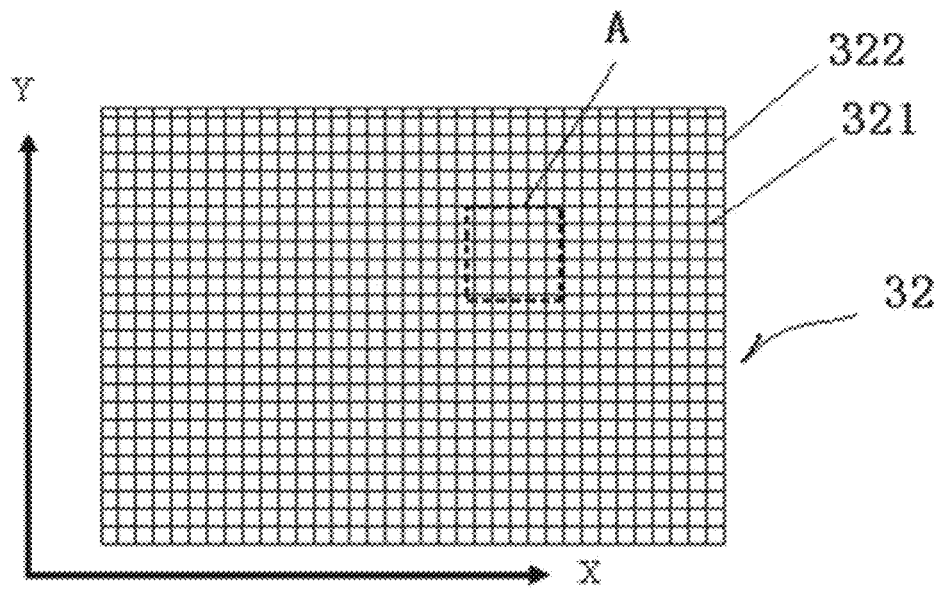
FIG. 5 is a schematic view showing a deformation layer before being deformed according to one embodiment of the present disclosure.
Figure 6:
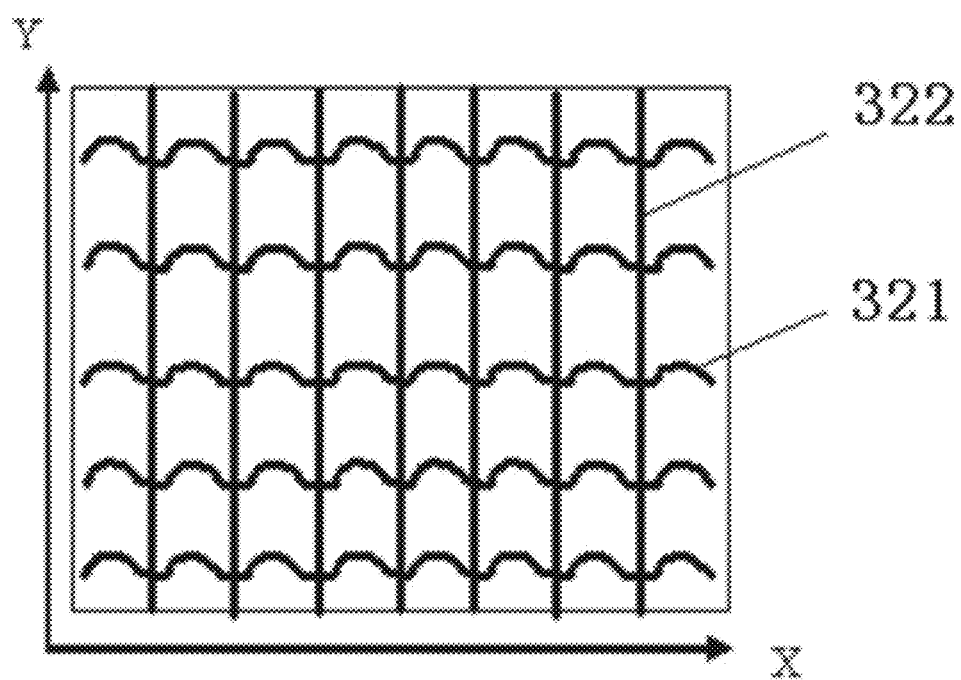
FIG. 6 is a topically enlarged view of portion A in FIG. 5.

Referring to FIGS. 5-6, the deformation layer 32 is formed as a grid including a plurality of segments 322 in a Y-axis direction and a plurality of segments 321 in an X-axis direction. The plurality of segments 322 in the Y-axis direction is arranged longitudinally and parallel to each other, and each segment 322 in the Y-axis direction is a straight line. The plurality of segments 321 in the X-axis direction is arranged laterally and parallel to each other, and each segment 321 in the X-axis direction is of a predetermined shape (see 321 in FIG. 6). This structure is simple and may easily be implemented.

The so-called "X-axis direction" and "Y-axis direction" are relative concepts to each other, and they are defined in a plane facing a reader. To be specific, a lateral direction is defined as the X-axis direction, while a longitudinal direction is defined as the Y-axis direction.

Figure 6A:
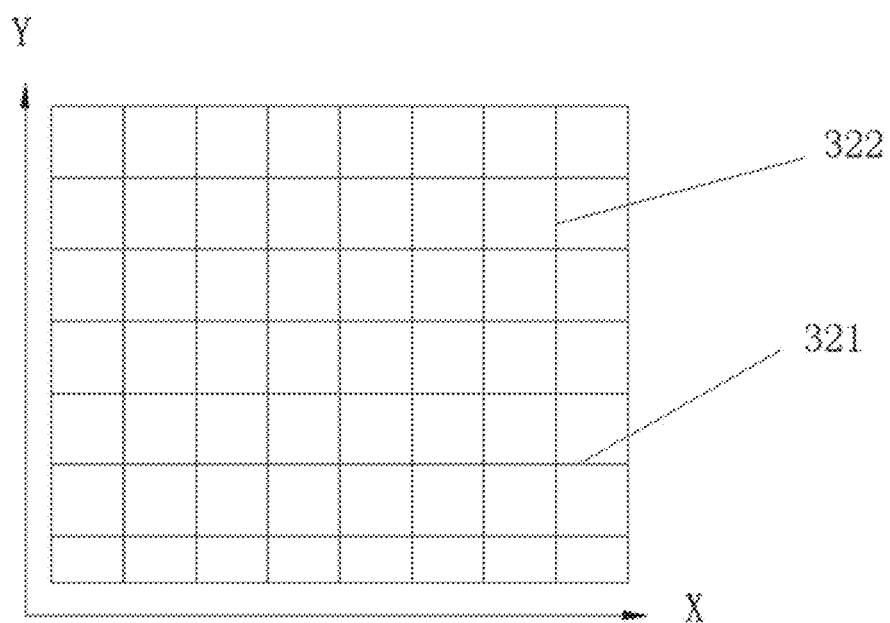
FIG. 6A is a schematic view showing segments in an X-axis direction and segments in a Y-axis direction in FIG. 6 after being deformed.

FIG. 6 is a schematic view showing the deformation layer 32 before being deformed. Before being deformed, each segment 321 in the X-axis direction is of the predetermined shape, e.g., a waveform shape, and each segment 322 in the Y-axis direction is a straight line. FIG. 6A is a schematic view showing the deformation layer 32 after being deformed. When the deformation layer 32 reaches the first deformation temperature, the segments 322 in the Y-axis direction are not deformed (i.e., each segment 322 in the Y-axis direction is still maintained as a straight line after the deformation layer 32 is deformed), and each segment 321 in the X-axis direction is deformed and extended as a straight line. The display panel I is of a constant size, so the display panel I is curved to achieve the curved-surface display.

The deformation layer 32 in FIG. 5 may be applied to the display device in FIG. 1. To be specific, the deformation layer 32 is arranged on the first substrate 1, i.e., the array substrate. Before being deformed, each segment 321 in the X-axis direction is of a waveform shape as shown in FIG. 6, and after being deformed, each segment 321 in the X-axis direction is a straight line as shown in FIG. 6A. At this point, the deformation layer 32 is extended to generate the first deformation.

It should be appreciated that, the deformation layer 32 in FIG. 5 may also be applied to the display device in FIG. 2, 3 or 4. When the deformation layer 32 is applied to the display device in FIG. 2, the deformation layer 32 is retracted to generate the first deformation. When the deformation layer 32 is applied to the display device in FIG. 3, the deformation layer 32 is extended to generate the first deformation. When the deformation layer 32 is applied to the display device in FIG. 4, the deformation layer 32 is retracted so as to generate the first deformation.

As shown in FIG. 5, the deformation layer 32 is a grid, and the light may be transmitted through each gap of the grid. Hence, the deformation layer 32 may be made of a transparent material or a nontransparent material.

As shown in FIG. 6, the predetermined shape of each segment 321 in the X-axis direction is a waveform shape. In this way, the structure is simple and may be easily implemented.

As shown in FIG. 6, all portions of each segment 321 in the X-axis direction are in the predetermined shape, i.e., the waveform shape. In this way, the structure is simple and may be easily implemented.

As shown in FIG. 6, all portions of each the segment 321 in the X-axis direction are in the predetermined shape and arranged uniformly. In this way, uniform deformation can be obtained.

Figure 6B:
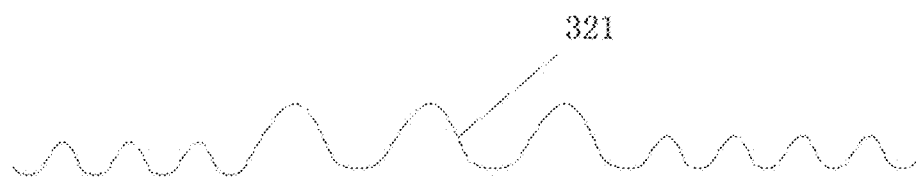
FIG. 6B is a schematic view showing the segment in the X-axis direction provided with an irregular predetermined shape in FIG. 6.

As shown in FIG. 6B, all portions of each segment 321 in the X-axis direction are in the predetermined shape but arranged non-uniformly. The so-called "non-uniformly" refers to the situation where the predetermined shapes are of different sizes and arranged at different densities. To be specific, the predetermined shapes at two end portions of each segment in the X-axis direction have a larger deformation amount (a large bending degree), i.e., small and dense waveform lines are provided at the two end portions. The predetermined shapes at a middle portion of each segment in the X-axis direction have a smaller deformation amount (a small bending degree), i.e., large and sparse waveform lines are provided in the middle portion.

Figure 7:
FIG. 7 is another schematic view showing the segment in the X-axis direction before being deformed according to one embodiment of the present disclosure.

As shown in FIG. 7, each segment 321 in the X-axis direction is topically provided with the portions with the predetermined shape along the X-axis direction. In this way, it is able to provide the deformation rapidly.

More specifically, as shown in FIG. 7, each segment 321 in the X-axis direction includes a middle portion in shape of a straight line and two end portions each of the predetermined shape. Since the middle portion of the display panel I is unnecessary to be deformed, thus, through the above structure, it is able to provide the deformation rapidly, thereby to achieve the curved-surface display rapidly.

Figure 8:
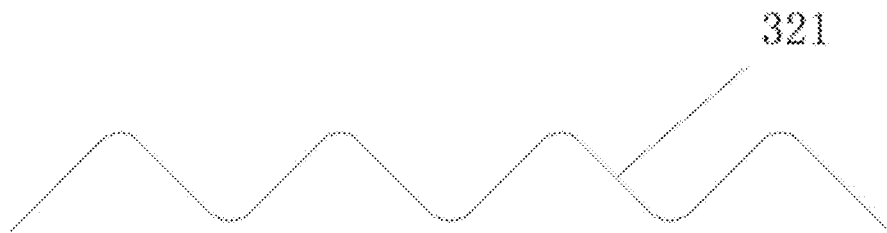
FIG. 8 is yet another schematic view showing the segment in the X-axis direction before being deformed according to one embodiment of the present disclosure.

As shown in FIG. 8, the predetermined shape of each segment 321 in the X-axis direction is a mountain-like line. More specifically, all portions of each segment 321 in the X-axis direction are in shape of mountain-like line. In this way, the structure is simple and may easily be implemented.

Figure 9:
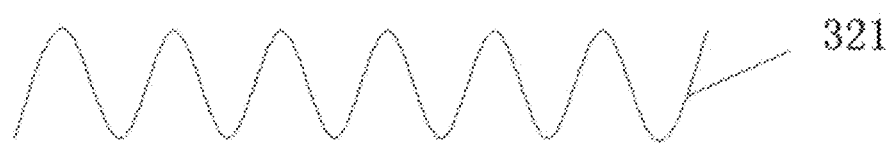
FIG. 9 is still yet another schematic view showing the segment in the X-axis direction before being deformed according to one embodiment of the present disclosure.

As shown in FIG. 9, the predetermined shape of each segment 321 in the X-axis direction is a hyperbolic curve. More specifically, all portions of each segment 321 in the X-axis direction are in shape of hyperbolic curve. In this way, the structure is simple and may easily be implemented.

Figure 10:
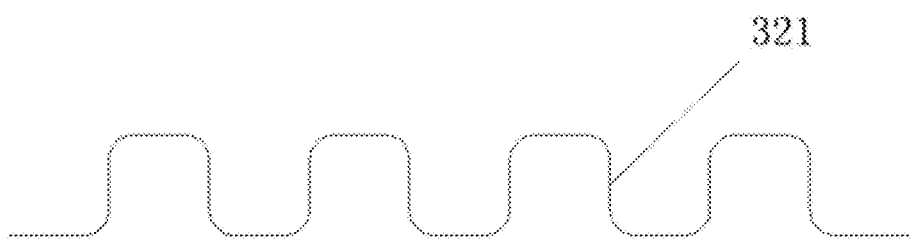
FIG. 10 is still yet another schematic view showing the segment in the X-axis direction before being deformed according to one embodiment of the present disclosure.

As shown in FIG. 10, the predetermined shape of each segment 321 in the X-axis direction is a rectangular wave. More specifically, all portions of each segment 321 in the X-axis direction are in shape of rectangular wave. In this way, the structure is simple and may easily be implemented.

Of course, it should be appreciated that, the predetermined shape of each segment 321 in the X-axis direction is not limited to the waveform line, the mountain-like line (FIG. 8), the hyperbolic curve (FIG. 9) or the rectangular wave (FIG. 10), and any other shape may also be applied, as long as the predetermined function may be achieved. In addition, the deformation amount of the portions of each segment 321 in the X-axis direction may be set in accordance with the size and the curvature of the display panel I, as long as the predetermined function may be achieved.

Figure 11:
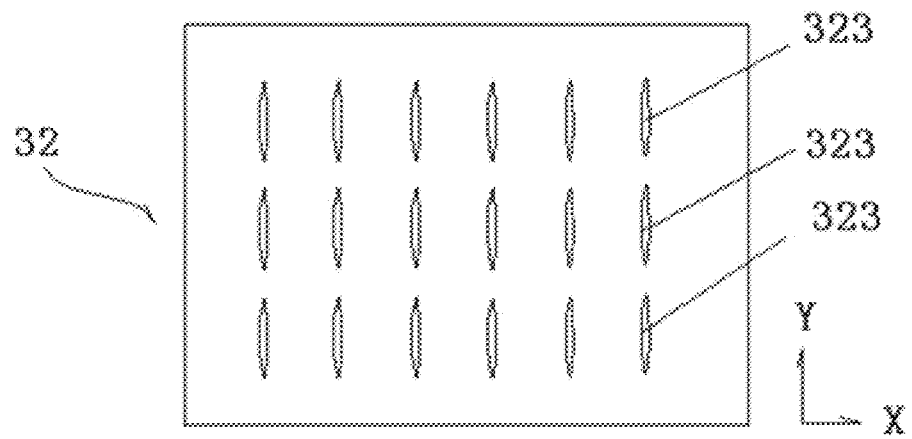
FIG. 11 is another schematic view showing the deformation layer before being deformed according to one embodiment of the present disclosure.

As shown in FIG. 11, optionally, the deformation layer 32 includes a plurality of elongated holes 323 arranged regularly. Each elongated hole 323 extends along the Y-axis direction.

In this embodiment, the deformation layer 32 is made of a transparent material.

In the embodiments of the present disclosure, the so-called "X-axis direction" and "Y-axis direction" are relative concepts to each other, and they are defined in a plane facing a reader. To be specific, a horizontal direction is defined as the "X-axis direction", while a longitudinal direction is defined as the "Y-axis direction".

Figure 12:
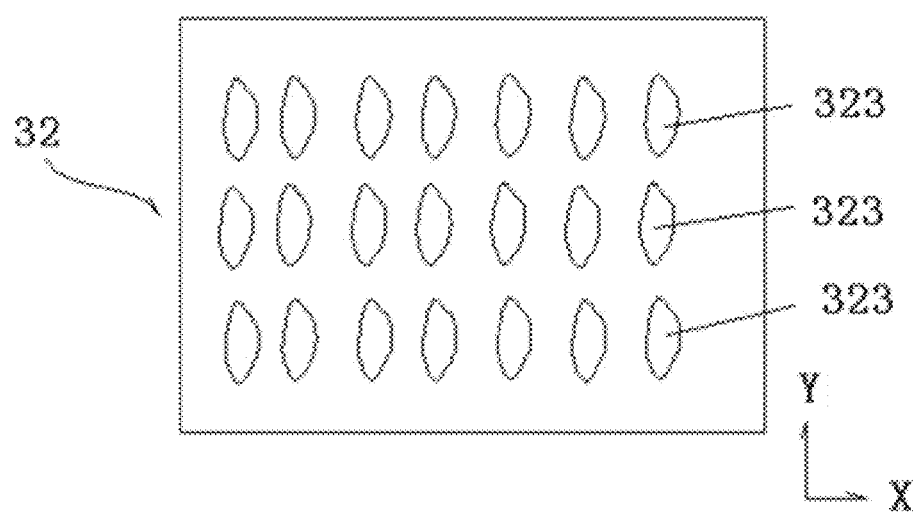
FIG. 12 is a schematic view showing the deformation layer in FIG. 11 after being deformed.

As shown in FIG. 12, when the deformation layer 32 reaches the first deformation temperature, each elongated hole 323 in the deformation layer 32 is deformed and extended in the X-axis direction to form an enlarged hole (indicated by 323 shown in FIG. 12). The display panel I is deformed at a certain curvature due to the internal force generated when the deformation layer 32 is deformed, so as to enable the display device to be curved relative to the Y-axis direction, thereby to enable the display device to be converted from the flat-surface display to the curved-surface display. When the deformation layer 32 reaches the second deformation temperature, each enlarged elongated hole 323 is restored from the shape shown in FIG. 12 to the shape shown in FIG. 11. As shown in FIG. 11, at the second deformation temperature, each enlarged elongated hole 323 is restored to the elongated hole 323 (shown in FIG. 11), and then the purpose of conversion from the curved-surface display to the flat-surface is achieved.

Of course, it should be appreciated that, the deformation layer in FIG. 1, 2, 3 or 4 may be used in FIG. 11.

As shown in FIG. 11, each elongated hole 323 may be a fusiform hole. In this way, the structure is simple and may easily be implemented.

Figure 13:
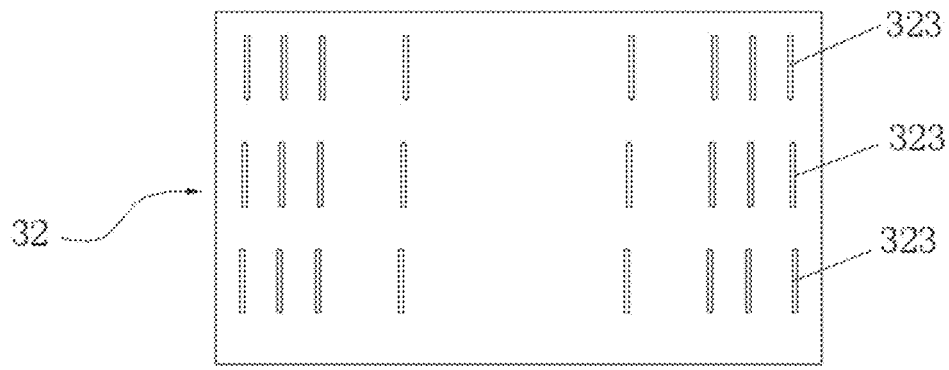
FIG. 13 is yet another schematic view showing the deformation layer before being deformed according to one embodiment of the present disclosure.

As shown in FIG. 13, each elongated hole 323 may be a rectangular hole. In this way, the structure is simple and may easily be implemented.

Of course, it should be appreciated that, each elongated hole 323 may not be limited to the fusiform hole or rectangular hole, and it may be of any other shape, as long as the deformation may be achieved.

Referring to FIGS. 1 and 13, the elongated holes 323 are arranged symmetrically relative to a longitudinal center line of the deformation layer 32. In this way, the structure is simple and may be easily implemented.

As shown in FIG. 11, the elongated holes 323 are arranged evenly, so as to achieve the deformation evenly.

As shown in FIG. 13, the elongated holes 323 are arranged unevenly, so as to achieve the deformation rapidly.

To be specific, as shown in FIG. 13, the elongated holes 323 are arranged sparser in the middle of the deformation layer and denser at the two ends of the deformation layer. Since the display panel I is unnecessary to be deformed in the middle, thus, through this structure, it is able to achieve the curved-surface display rapidly.

As shown in FIG. 1, the deformation layer 32 is extended to generate the first deformation. In the embodiments of the present disclosure, the deformation layer 32 is provided with the predetermined shape (indicated by 321 in FIG. 6) at the second deformation temperature (20° C. to 25° C.), and generates the first deformation at the first deformation temperature (80° C. to 90° C.) and generates the second deformation at the second deformation temperature (20° C. to 25° C.). Of course, it should be appreciated that, the deformation layer 32 in FIGS. 2-13 may be also be extended to generate the first deformation. The first deformation temperature may be 20° C. to 25° C., or any other temperatures, and the second deformation temperature may be 80° C. to 90° C., or any other temperatures. The deformation temperatures may be set in accordance with process conditions, such as properties of liquid crystals, the deformation layer or any other material, and temperature range for the manufacture.

It should be appreciated that, referring to FIG. 1, the deformation layer 32 may also be retracted to generate the first deformation. Different from the situation where the deformation layer 32 is extended to generate the first deformation, in this embodiment, the deformation layer 32 is provided with the predetermined shape (indicated by 321 in FIG. 6) at the first deformation temperature (80° C. to 90° C.). The deformation layer 32 generates the first deformation (the conversion from the flat-surface display to the curved-surface display) at the first deformation temperature, and generates the second deformation (the conversion from the curved-surface display to the flat-surface display) at the second deformation temperature (20° C. to 25° C.). It should be further appreciated that, the deformation layer 32 in FIGS. 2-13 may be retracted to generate the first deformation. The first deformation temperature may be 20° C. to 25° C., or any other temperature, and the second deformation temperature may be 80° C. to 90° C., or any other temperature. The deformation temperatures may be set in accordance with process conditions, such as properties of liquid crystals, the deformation layer or any other material, and temperature range for the manufacture.

Figure 14:
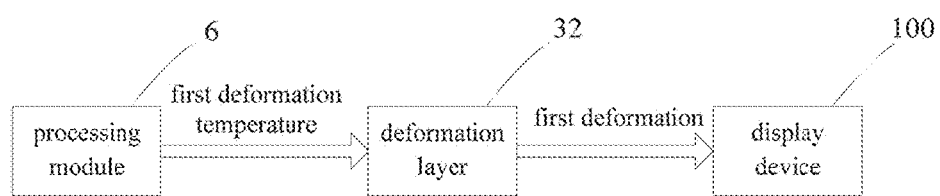
FIG. 14 is a logic control diagram of the display device for achieving the curved-surface display according to one embodiment of the present disclosure.

As shown in FIG. 14, the display device 100 may further include a processing module 6 configured to calculate the deformation amount of the deformation layer 32 in accordance with the curvature, and calculate the first deformation temperature in accordance with the deformation amount. The display device 100 adjusts temperatures in accordance with the first deformation temperature, so as to generate the first deformation.

In the embodiments of the present disclosure, a plurality of predetermined curvatures may be provided, and one of them may be selected by the viewer. The first deformation temperature corresponding to the selected curvature is calculated by the processing module 6, so as to enable the deformation layer 32 to generate the first deformation, thereby to enable the display device 100 to achieve the curved-surface display at the selected curvature. Through the above operation, it is able to provide the display device 100 with different curvatures.

The processing module 6 may be applied to the display device in FIGS. 1-4.

Figure 15:
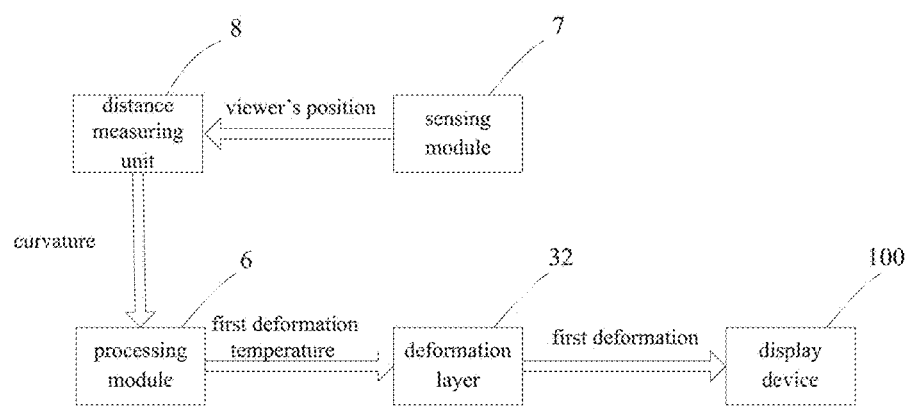
FIG. 15 is another logic control diagram of the display device for achieving the curved-surface display according to one embodiment of the present disclosure.

As shown in FIG. 15, the display device 100 may further include a sensing module 7 and a distance measuring unit 8. The sensing module 7 is connected to the processing module 6 via the distance measuring unit 8. The sensing module 7 is configured to detect a position of the viewer. The distance measuring unit 8 is configured to acquire a distance L between the viewer and the display panel and convert it into the curvature. For example, the distance measuring unit 8 may convert the distance L into an optimal curvature suitable for the viewer at the position. The processing module 6 is configured to calculate the deformation amount of the deformation layer 32 in accordance with the curvature, and calculate the first deformation temperature in accordance with the deformation amount.

In the embodiments of the present disclosure, the position of the viewer is detected by the sensing module 7, the distance between the viewer and the display panel is calculated by the distance measuring unit 8, and the curvature is acquired in accordance with the distance. Next, the deformation amount of the deformation layer 32 corresponding to the curvature is calculated by the processing module 6, and the first deformation temperature is calculated in accordance with the deformation amount. Then, the deformation layer 32 generates the first deformation in accordance with the first deformation temperature, so as to enable the display device 100 to achieve the curved-surface display at the curvature. When the viewers are located at different positions, the above operation may be repeated so as to achieve the curved-surface display at different curvatures, thereby to provide the viewers at different positions with an optimal viewing effect.

The processing module 6 may be applied to the display device in FIGS. 1-4.

To be specific, as shown in FIG. 1, the first substrate 1 and the second substrate 2 may be a resin substrate or a glass substrate. Of course, the first substrate 1 and the second substrate 2 are not limited thereto, and any other substrate may also be used, as long as the design requirement may be met.

As shown in FIG. 1, the display panel I may further include a first polarizer 4 arranged above the first substrate 1 and a second polarizer 5 arranged below the second substrate 2. The terms "above" and "below" are relative concepts to each other, and they just refer to the positions as viewed in FIG. 1.

As shown in FIG. 1, the display device is not limited to the TV, and it may also be any product or member having a display function, such as a liquid crystal display panel, an Organic Light-Emitting Diode (OLED) panel, a mobile phone, a flat-panel computer, a display, a laptop computer, a digital photo frame or a navigator.

Further, As shown in FIG. 1, when the display device is a mobile phone, a flat-panel computer, a display or a laptop computer, it may further include a backlight assembly. In order to achieve the display effect in a better manner, the backlight assembly also has a conversion function from the curved-surface display to the flat-surface display and a conversion function from the flat-surface display to the curved-surface display. Technically, the backlight assembly may be made of a shape memory polymer or a shape memory polymer alloy with a certain mechanical strength, and assembled with the display panel I by injection-molding or any other methods, so as to be deformed together with the display panel I.

Second Embodiment

Figure 16:
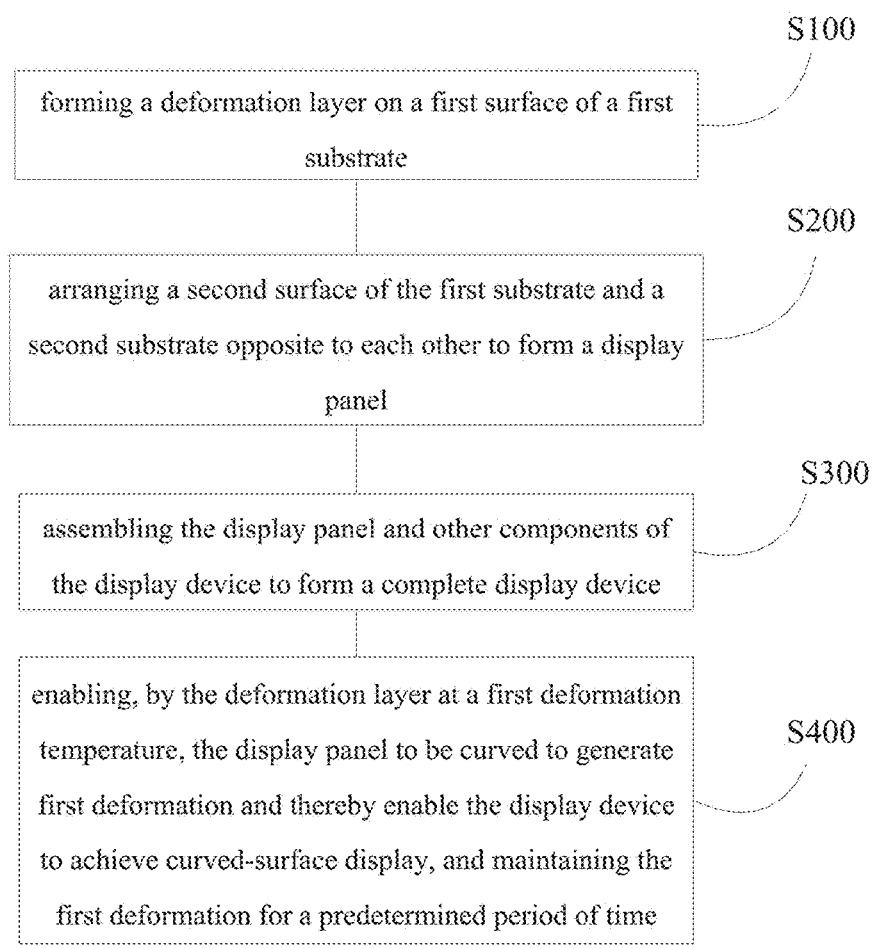
FIG. 16 is a flow chart of a method for manufacturing a display device according to one embodiment of the present disclosure.

As shown in FIG. 16, the present disclosure provides in this embodiment a method for manufacturing the display device, which includes following steps.

Step S100 of forming the deformation layer 32 (as shown in FIG. 1, 2, 3 or 4) on the first surface 11 of the first substrate (as shown in FIG. 1, 2, 3 or 4).

Step S200 of arranging the second surface 12 of the first substrate (as shown in FIG. 1, 2, 3 or 4) and the second substrate 2 (as shown in FIG. 1, 2, 3 or 4) opposite to each other, thereby forming the display panel I (as shown in FIG. 1, 2, 3 or 4).

Step S300 of assembling the display panel I (as shown in FIG. 1, 2, 3 or 4) with other components of a display device, thereby forming a complete display device.

Step S400 of enabling, by the deformation layer (as shown in FIG. 1, 2, 3 or 4) at the first deformation temperature, the display panel I (as shown in FIG. 1, 2, 3 or 4) to be curved and generate first deformation to enable the display device to achieve the curved-surface display for a predetermined period of time.

Step S200 of forming the display panel I (referring to FIG. 1, 2, 3 or 4) and Step S300 of assembling the display panel I (referring to FIG. 1, 2, 3 or 4) with the other components of the display device are identical to those known in the art.

The display device manufactured in this embodiment is completely the same as that mentioned in the first embodiment, so the structures thereof are not repeated herein.

According to this embodiment, since the method includes all contents of the display device in the first embodiment, thus, the method can obtain all effects of the display device. The deformation layer 32 is arranged on any surface of the display panel I. When reaching the first deformation temperature, the deformation layer 32 generates the first deformation, and applies an internal force onto the display panel I. Because the display panel I is of a constant size, as shown in FIG. 1A, the display panel I may be curved due to the internal force, so as to achieve the curved-surface display. In other words, the display panel I in the embodiment of the present disclosure is curved due to the internal force generated by itself, and the curved shape may be always maintained under the effect of the internal force. As a result, it is unnecessary to maintain the curved shape of the display panel using a shell of an existing backlight assembly, and thereby it is able to reduce the assembly difficulty.

In addition, in the embodiment of the present disclosure, the deformation layer 32 is arranged on any surface of the display panel I so as to achieve the curved-surface display, and it is unnecessary to maintain the curved shape of the display panel using the shell of the existing backlight assembly, so the integration of the display panel I can be improved.

In addition, in the embodiment of the present disclosure, the deformation layer 32 is arranged on any surface of the display panel I so as to achieve the curved-surface display, and it is unnecessary to maintain the curved shape of the display panel using the shell of the existing backlight assembly, so the display panel may be applied to a transparent display device without any backlight assembly, thereby to provide a wider application range.

In addition, in the embodiment of the present disclosure, the deformation layer 32 is arranged on any surface of the display panel I so as to achieve the curved-surface display, and it is unnecessary to maintain the curved shape of the display panel using the shell of the existing backlight assembly, so a light and thin display device is provided.

In this embodiment, as shown in FIG. 1 or 3, the first substrate 1 is an array substrate, and the second substrate 2 is a color filter substrate. The first surface 11 of the first substrate refers to a surface of the first substrate away from the second substrate 2, and the other surface is just the second surface 12 of the first substrate. The first surface 21 of the second substrate refers to a surface of the second substrate away from the first substrate 1, and the other surface is just the second surface 22 of the second substrate.

It should be appreciated that, the first substrate 1 and the second substrate 2 are relative concepts to each other, and referring to FIG. 2 or 4, the first substrate 1 may also be a color filter substrate, while the second substrate 2 may also be an array substrate.

Referring to FIG. 16, in this embodiment, the first substrate 1 is an array substrate (as shown in FIG. 1 or 3), and before the formation of the deformation layer 32 (as shown in FIG. 1 or 3) onto the first surface 11 of the first substrate (as shown in FIG. 1 or 3), the patterns for the array substrate (indicated by 1 in FIG. 1 or 3) have been formed on the second surface 12 of the first substrate (as shown in FIG. 1 or 3).

Figure 17:
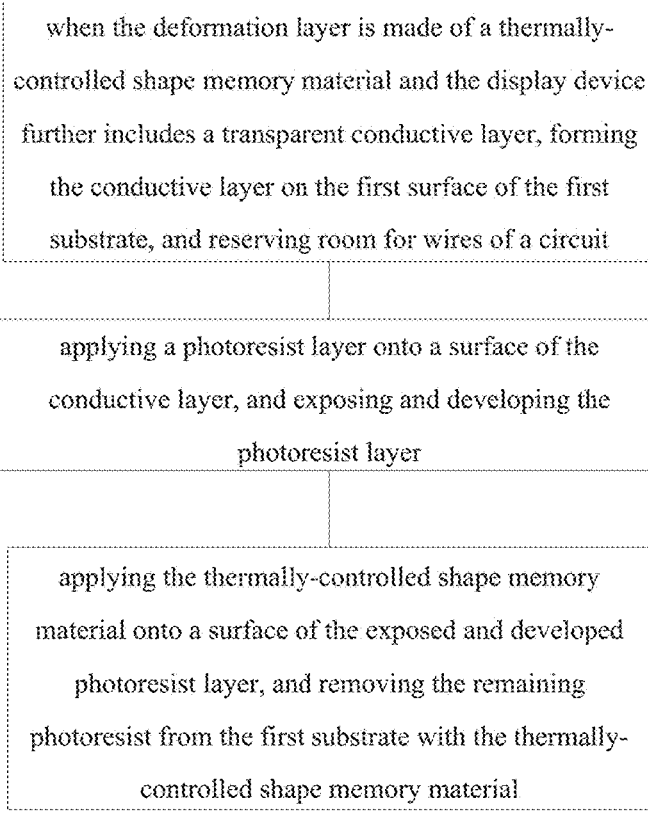
FIG. 17 is a flow chart of a method for forming the deformation layer according to one embodiment of the present disclosure.
Figure 18:
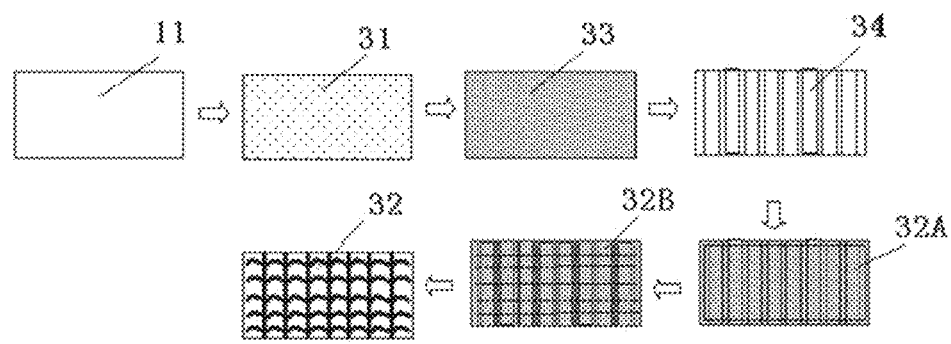
FIG. 18 is a schematic view showing the formation of the deformation layer according to one embodiment of the present disclosure.

FIG. 17 is a flow chart of a method for forming the deformation layer, and FIG. 18 is a schematic view showing the formation of the deformation layer. In FIG. 17, the manufacture of the structure in FIG. 1 or 2 is taken as an example. As shown in FIG. 18, the deformation 32 may be made of a thermally-controlled shape memory material 32A, and the display device may further include the conductive layer 31.

Step S100 of forming the deformation layer 32 (referring to FIG. 18) on the first surface 11 (referring to FIG. 18) of the first substrate includes following steps.

Step S101 of forming the conductive layer 31 (referring to FIG. 18) on the first surface 11 (referring to FIG. 18) of the first substrate and reserving sufficient room for wires of a circuit.

Step S102 of applying a photoresist layer 34 (referring to FIG. 18) onto a surface of the conductive layer 31 (referring to FIG. 18), and exposing and developing the photoresist layer.

Step S103 of applying the thermally-controlled shape memory material 32A (referring to FIG. 18) onto a surface of the exposed and developed photoresist layer 34 (referring to FIG. 18), and removing the remaining photoresist from the first substrate 1 (referring to FIG. 1 or 2) with the thermally-controlled shape memory material 32A (referring to FIG. 18).

This process is simple and may be easily performed.

In FIG. 18, the manufacture of the deformation layer 32 in FIG. 5, 6, 7, 8 or 9 is taken as an example.

It should be appreciated that, the method in FIG. 17 may also be used to manufacture the deformation layer 32 in FIG. 11 or 13.

As shown in FIG. 18, the conductive layer 31 is formed on the first surface 11 of the first substrate by sputtering.

Optionally, the reserved photoresist partially overlaps a black matrix Y of the display panel I (referring to FIG. 1 or 2), so as to prevent the light transmittance from being adversely affected as possible.

In this embodiment, as shown in FIG. 18, the deformation layer 32 may be made of a transparent material, i.e., the thermally-controlled shape memory material 32A is transparent. Step S103 (referring to FIG. 17) of removing the remaining photoresist from the first substrate 1 (referring to FIG. 1 or 2) with the thermally-controlled shape memory material 32A includes: removing the remaining photoresist from the first substrate 1 (referring to FIG. 1 or 2) with the thermally-controlled shape memory material 32A using a secondary exposing and developing process 32B.

This process is simple and may be performed conveniently.

as shown in FIG. 18, the deformation layer 32 may also be made of a nontransparent material, i.e., the thermally-controlled shape memory material 32A is nontransparent. Step S103 (referring to FIG. 17) of removing the remaining photoresist from the first substrate 1 (referring to FIG. 1 or 2) with the thermally-controlled shape memory material 32A includes: removing the remaining photoresist from the first substrate 1 (referring to FIG. 1 or 2) with the thermally-controlled shape memory material 32A using an alkaline stripping liquid.

This process is simple and may be performed conveniently.

Figure 19:
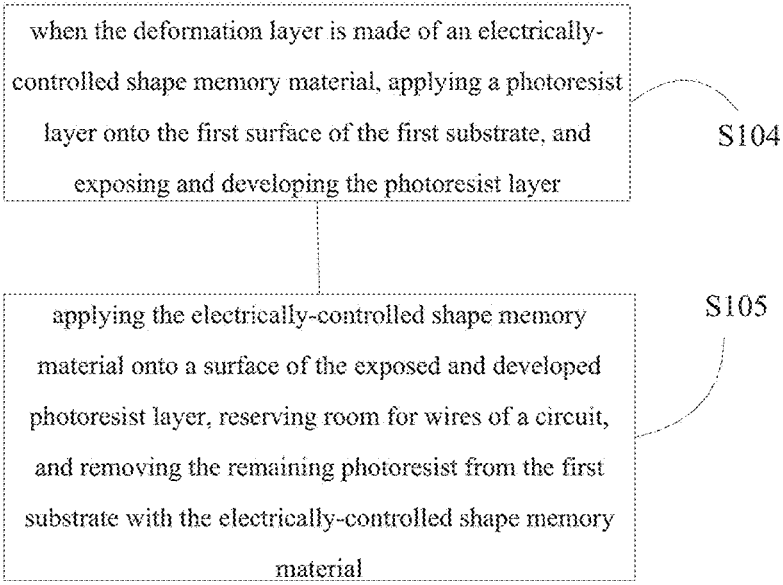
FIG. 19 is another flow chart of the method for forming the deformation layer according to one embodiment of the present disclosure.
Figure 20:
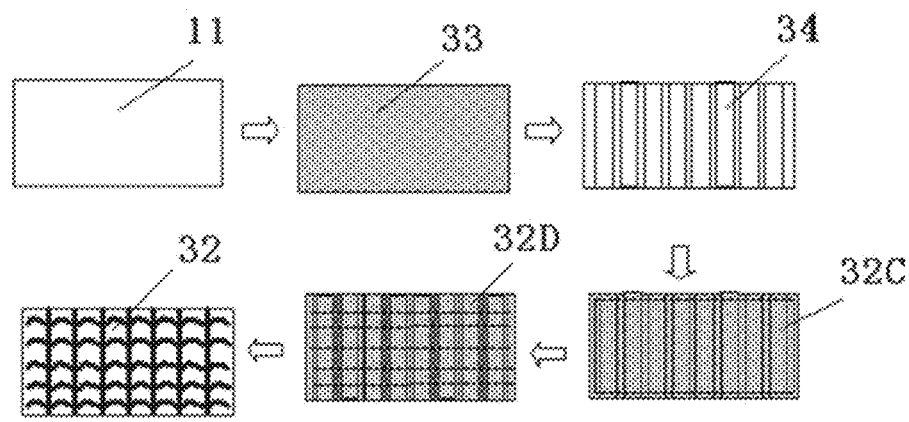
FIG. 20 is a schematic view showing the formation of the deformation layer according to one embodiment of the present disclosure.

FIG. 19 is another flow chart of a method for forming the deformation layer, and FIG. 20 is a schematic view showing the formation of the deformation layer. The manufacture of the structure in FIG. 3 or 4 will be taken as an example. The deformation layer 32 (referring to FIG. 20) may be made of an electrically-controlled shape memory material 32C, and Step S100 (referring to FIG. 20) of forming the deformation layer 32 (referring to FIG. 20) on the first surface 11 (referring to FIG. 20) of the first substrate includes following steps.

Step S104 of applying a photoresist layer 34 (referring to FIG. 20) onto the first surface 11 (referring to FIG. 20) of the first substrate, and exposing and developing the photoresist.

Step S105 of applying the electrically-controlled shape memory material 32C (referring to FIG. 20) onto a surface of the exposed and developed photoresist layer 34 (referring to FIG. 20), reserving sufficient room for wires of a circuit, and removing the remaining photoresist from the first substrate (referring to FIG. 3 or 4) with the electrically-controlled shape memory material 32C (referring to FIG. 20).

This process is simple and may be performed conveniently.

Optionally, the reserved photoresist may partially overlap the black matrix Y of the display panel I, so as to prevent the light transmittance from being adversely affected as possible.

Referring to FIG. 20, in this embodiment, the deformation layer 32 may be made of a transparent material, i.e., the electrically-controlled shape memory material 32C is transparent. Step S105 (referring to FIG. 19) of removing the remaining photoresist from the first substrate 1 (referring to FIG. 3 or 4) with the electrically-controlled shape memory material 32C includes: removing the remaining photoresist from the first substrate 1 (referring to FIG. 3 or 4) with the electrically-controlled shape memory material 32C using a secondary exposing and developing process 32B.

This process is simple and may be performed conveniently.

Referring to FIG. 20, in this embodiment, the deformation layer 32 may also be made of a nontransparent material, i.e., the electrically-controlled shape memory material 32C is nontransparent. Step S105 (referring to FIG. 19) of removing the remaining photoresist from the substrate 1 (referring to FIG. 3 or 4) with the electrically-controlled shape memory material 32C includes: removing the remaining photoresist from the first substrate 1 (referring to FIG. 3 or 4) with the electrically-controlled shape memory material 32C using an alkaline stripping liquid.

This process is simple and may be performed conveniently.

The serial numbers of the embodiments are merely used to facilitate the description, but shall not represent any importance.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. A display device, comprising:
   a first substrate;
   a second substrate arranged opposite to the first substrate to form a display panel; and
   a deformation layer arranged at any surface of the display panel;
   wherein the deformation layer is configured to enable the display panel to generate first deformation when the deformation layer reaches a first deformation temperature, so as to enable the display device to achieve curved-surface display;
   wherein the deformation layer is formed as a grid comprising a plurality of segments in a Y-axis direction and a plurality of segments in an X-axis direction; the plurality of segments in the Y-axis direction is arranged longitudinally and parallel to each other, each segment in the Y-axis direction is a straight line; the plurality of segments in the X-axis direction is arranged laterally and parallel to each other, and each segment in the X-axis direction is provided with a predetermined shape.

2. The display device according to claim 1, wherein the deformation layer is made of an electrically-controlled shape memory material; the deformation layer reaches the first deformation temperature through heat generated when the deformation layer is energized.

3. The display device according to claim 2, wherein the electrically-controlled shape memory material is a shape memory polymer doped with conductive carbon black, metallic powder or conductive polymer.

4. The display device according to claim 2, wherein the display panel further comprises a driver circuit connected to the deformation layer.

5. The display device according to claim 1, wherein the deformation layer is made of a thermally-controlled shape memory material; the display device further comprises a conductive layer, the conductive layer and the deformation layer are arranged on any surface of the display panel from the bottom up, and the deformation layer reaches the first deformation temperature through heat generated when the conductive layer is energized.

6. The display device according to claim 5, wherein the thermally-controlled shape memory material is a shape memory polymer.

7. The display device according to claim 5, wherein the display panel further comprises a driver circuit connected to the conductive layer.

8. The display device according to claim 1, wherein the deformation layer is configured to enable the display panel to generate a second deformation when the deformation layer is restored from the first deformation temperature to a second deformation temperature, to enable the display device to achieve flat-surface display;
wherein the first deformation temperature is 80° C. to 90° C. and the second deformation temperature is 20° C. to 25° C.; or,
the first deformation temperature is 20° C. to 25° C. and the second deformation temperature is 80° C. to 90° C.

9. The display device according to claim 1, wherein the predetermined shape of each segment in the X-axis direction is a waveform line, a mountain-like line, a hyperbolic curve or a rectangular-wave.

10. The display device according to claim 9, wherein all portions of each segment in the X-axis direction are in a shape of the predetermined shape.

11. The display device according to claim 10, wherein the portions of each segment in the X-axis direction are arranged non-uniformly;
the predetermined shape at two end portions of each segment in the X-axis direction has a larger deformation amount; the predetermined shape at a middle portion of each segment in the X-axis direction has a smaller deformation amount.

12. The display device according to claim 9, wherein each segment in the X-axis direction is topically in a shape of the predetermined shape.

13. The display device according to claim 12, wherein each segment in the X-axis direction comprises a middle portion in a shape of a straight-line, and two end portions each in a shape of the predetermined shape.

14. A method for manufacturing the display device according to claim 1, comprising steps of:
forming a deformation layer on a first surface of a first substrate;
arranging a second surface of the first substrate and a second substrate opposite to each other, thereby forming a display panel;
assembling the display panel with other components of the display device, thereby forming a complete display device; and
enabling, by the deformation layer at a first deformation temperature, the display panel to be curved and generate first deformation to enable the display device to achieve curved-surface display, and maintaining the first deformation for a predetermined period of time.

15. The method according to claim 14, wherein the deformation layer is made of a thermally-controlled shape memory material, and the display device further comprises a conductive layer; and
the step of forming the deformation layer on the first surface of the first substrate comprises:
forming the conductive layer on the first surface of the first substrate, and reserving room for wires of a circuit;
applying a photoresist layer onto a surface of the conductive layer, and exposing and developing the photoresist layer; and
applying the thermally-controlled shape memory material onto a surface of the exposed and developed photoresist layer, and removing the remaining photoresist from the first substrate with the thermally-controlled shape memory material;
or, wherein the deformation layer is made of an electrically-controlled shape memory material, and the step of forming the deformation layer on the first surface of the first substrate comprises:
applying a photoresist layer onto the first surface of the first substrate, and exposing and developing the photoresist layer; and
applying the electrically-controlled shape memory material onto a surface of the exposed and developed photoresist layer, reserving room for wires of a circuit, and removing the remaining photoresist from the first substrate with the electrically-controlled shape memory material.

16. The method according to claim 15, wherein the deformation layer is made of a transparent material, and the step of removing the remaining photoresist from the first substrate with the thermally-controlled or electrically-controlled shape memory material comprises: removing the remaining photoresist from the first substrate with the thermally-controlled or electrically-controlled shape memory material by a secondary exposing and developing process; or,
wherein the deformation layer is made of a nontransparent material, and the step of removing the remaining photoresist from the first substrate with the thermally-controlled or electrically-controlled shape memory material comprises: removing the remaining photoresist from the first substrate with the thermally-controlled or electrically-controlled shape memory material using an alkaline stripping liquid.

17. A display device, comprising:
a first substrate;
a second substrate arranged opposite to the first substrate to form a display panel; and
a deformation layer arranged at any surface of the display panel;
wherein the deformation layer is configured to enable the display panel to generate first deformation when the deformation layer reaches a first deformation temperature, so as to enable the display device to achieve curved-surface display;
wherein the deformation layer comprises a plurality of elongated holes arranged regularly, and each elongated hole extends along the Y-axis direction.

18. The display device according to claim 17, wherein the elongated holes are arranged sparser in a middle of the deformation layer and denser at two ends of the deformation layer.

19. A display device, comprising:
a first substrate;
a second substrate arranged opposite to the first substrate to form a display panel; and
a deformation layer arranged at any surface of the display panel;
wherein the deformation layer is configured to enable the display panel to generate first deformation when the deformation layer reaches a first deformation temperature, so as to enable the display device to achieve curved-surface display;
wherein the display device further comprises a processing module configured to calculate a deformation amount of the deformation layer in accordance with a curvature, and calculate the first deformation temperature in accordance with the deformation amount;

wherein the display device further comprises a sensing module and a distance measuring unit through which the sensing module is connected to the processing module;

wherein the sensing module is configured to detect a viewer's position, and the distance measuring unit is configured to acquire a distance between the viewer and the display device and convert the distance into the curvature.

* * * * *